United States Patent
Tsukihashi et al.

(10) Patent No.: US 7,365,296 B2
(45) Date of Patent: Apr. 29, 2008

(54) LIGHT RECEPTION OUTPUT CONTROLLING APPARATUS OF PHOTO DETECTOR IN OPTICAL PICKUP UNIT

(75) Inventors: Akira Tsukihashi, Gunma (JP); Shigeru Nakamura, Tokyo (JP); Misao Kuramochi, Gunma (JP); Mitsuhiro Hiruma, Gunma (JP); Michiyoshi Sawada, Gunma (JP); Hiromitsu Kondo, Tochigi (JP)

(73) Assignee: Sanyo Electric Co., Ltd., Osaka (JP)

( * ) Notice: Subject to any disclaimer, the term of this patent is extended or adjusted under 35 U.S.C. 154(b) by 63 days.

(21) Appl. No.: 11/427,703

(22) Filed: Jun. 29, 2006

(65) Prior Publication Data

US 2007/0001092 A1 Jan. 4, 2007

(30) Foreign Application Priority Data

Jul. 1, 2005 (JP) ............... 2005-193890

(51) Int. Cl.
*G02B 7/04* (2006.01)
(52) U.S. Cl. ............... 250/201.3; 250/214 R
(58) Field of Classification Search ............ 250/201.3, 250/201.5, 214 R, 214 A, 214 LA; 369/44.29, 369/44.37, 44.32, 44.41, 44.34, 44.21
See application file for complete search history.

(56) References Cited

U.S. PATENT DOCUMENTS 6,996,038 B2 * 2/2006 Kuwayama ............ 369/44.29

FOREIGN PATENT DOCUMENTS

JP 2002-32924 1/2002
JP 2005-71458 3/2005

* cited by examiner

*Primary Examiner*—Que T Le
(74) *Attorney, Agent, or Firm*—Fish & Richardson P.C.

(57) ABSTRACT

In the optical pickup unit configured to guide a laser beam emitted from a laser source to an objective lens, to converge the laser beam with the objective lens to be irradiated to a disk, and to guide the laser beam reflected and returned by the disk to the photo detector including a light reception region constituted by a plurality of segments, the photo detector is disposed with each amplifier corresponding to each segment of the light reception region, is disposed with each output terminal that outputs each light reception output corresponding to each segment from the photo detector via each amplifier, and is disposed with an output setting circuit that sets each light reception output from each of the output terminals by changing the gain of each of the amplifiers and/or by attenuating the input or output of each of the amplifiers with an attenuator.

10 Claims, 4 Drawing Sheets

LIGHT RECEPTION OUTPUT CONTROLLING APPARATUS OF PHOTO DETECTOR IN OPTICAL PICKUP UNIT

CROSS-REFERENCE TO RELATED APPLICATIONS

This application claims priority from Japanese Patent Application No. 2005-193890 filed on Jul. 1, 2005, which is herein incorporated by reference.

BACKGROUND OF THE INVENTION

1. Field of the Invention

The present invention relates generally to a light reception output controlling apparatus of a photo detector in an optical pickup unit that is configured to guide a laser beam reflected and returned from a disk to the photo detector including a light reception region constituted by a plurality of segments and, more particularly, to a light reception output controlling apparatus of a photo detector in an optical pickup unit that takes measures against an output difference in each light reception output from the photo detector, which is caused by displacement of a light reception spot projected on the light reception region of the photo detector.

2. Description of the Related Art

In an optical pickup unit that optically records and reproduces signals with the use of laser beams to an optical disk such as CD and DVD, an astigmatic method and an application thereof, i.e., a differential astigmatic method are widely used for the focus control that focuses a laser beam irradiated to disk on a signal layer of the disk.

On the other hand, for the tracking control that makes the laser beam irradiated to disk follow a signal track of the disk, one of a three-beam method, a push-pull method, a phase difference method, and applications thereof is employed correspondingly to a disk standard.

For example, an actual example of an optical pickup unit corresponding to various record/reproduction CD as well as DVD-ROM and DVD±R/RW employs the astigmatic method for the various record/reproduction CD and the differential astigmatic method, which is an application of the astigmatic method, for various record/reproduction DVD with regard to the focus control mode and employs the phase difference method for DVD-ROM and a differential push-pull method, which is an application of the push-pull method, for DVD±R/RW and CD with regard to the tracking control mode.

When a basic version and an applied version of the astigmatic method is employed in the focus control, the photo detector includes an astigmatism generation optical system such as an anamorphic lens that generates astigmatism in the reflected laser beam from the disk and a parallel plate disposed in a tilted manner relative to the light axis as well as a light reception region divided into four parts with two orthogonal dividing line forming an angle of 45 degrees relative to the generation direction of the astigmatism.

On the other hand, since three beams are needed for the laser beams irradiated to the disk in the differential astigmatic method of the focus control mode and the differential push-pull method or three-beam method of the tracking control mode, an optical pickup unit employing these modes includes a diffraction grating for diffracting and dividing the laser beam emitted from a semiconductor laser into three beams that are 0th-order light and ±1st-order diffracted light and uses a photo detector including three light reception regions that receives three reflected laser beams, which are these three beams reflected by the disk, as is well known.

By the way, when the optical pickup unit is assembled, the photo detector is positioned and attached to an optical housing disposed with optical devices of the optical pickup unit. See Japanese Patent Application Laid-Open Publication No. 2005-71458.

In the positioning of the photo detector, to obtain appropriate light reception output from each segment constituting the light reception region when a laser spot projected on the light reception region of the photo detector is correctly disposed, a focus error signal and a tracking error signal generated from each light reception output with predetermined calculations is allowed to have S-shaped curve characteristics with suitable symmetric property and amplitude relative to a focus servo and racking servo, and a wobble signal with suitable amplitude is obtained from wobble formed in the DVD recording disk or CD recording disk.

However, although the photo detector is positioned to the optical housing, the laser spot may not be projected correctly on the light reception region of the photo detector because of attachment errors, remaining stress at the time of the attachment, or an application amount output difference and changes over time of the used adhesive, and it is problematic that the focus servo characteristics and tracking servo characteristics may be deteriorated and the amplitude of the wobble signal may be reduced.

In the optical pickup unit employing the differential astigmatic method for the focus control, to take measures to the above problem, it is known to use an offset correction apparatus that corrects an offset based on the position of the light reception spot projected on the light reception region by adjusting a level of a predetermined light reception output relating to the focus error signal such that each light reception output of the four-divided light reception region in the light reception state when the focus error signal becomes "0" (Japanese Patent Application Laid-Open Publication No. 2002-32924).

By the way, in the offset correction apparatus shown in Japanese Patent Application Laid-Open Publication No. 2002-32924, the focus error signal is used, and a configuration including a focus error signal generation circuit that generates the focus error signal by calculating each light reception output of the light reception region of the photo detector, is considered. Since the focus error signal generation circuit is typically built into a disc drive and an apparatus disposed with the focus error signal generation circuit is not shown, the offset correction apparatus is not considered to be self-contained in a single optical pickup unit.

Therefore, unless the disk drive is built into the optical pickup unit, the offset correction is not performed for each light reception output of the four-divided light reception region, and this is difficult to achieve since manufacturers of the optical pickup unit and the disk drive are generally independent from each other.

Although the offset correction apparatus can correct inequality of each light reception output on each diagonal line in the four-divided light reception region generating the focus error signal since the focus error signal is used, inequality is not necessarily corrected in adjacent light reception outputs divided by each dividing line orthogonal to each other in the four-divided light reception region.

Therefore, if the inequality of each light reception output of the four-divided light reception region is corrected by the method using the focus error signal, sufficient effects may not be obtained in improving the amplitude characteristics of the wobble signal or the tracking servo characteristics when the employed tracking control method is the push-pull method or the differential push-pull method that is the application thereof.

SUMMARY OF THE INVENTION

The present invention solving the aforementioned problem is mainly a light reception output controlling apparatus of a photo detector in an optical pickup unit, and the photo detector including a light reception region constituted by a plurality of segments is disposed with each amplifier corresponding to each segment of the light reception region, is disposed with each output terminal that outputs each light reception output corresponding to each segment from the photo detector via each amplifier, and is disposed with an output setting circuit that sets each light reception output from each of the output terminals by changing the gain of each of the amplifiers and/or by attenuating the input or output of each of the amplifiers with an attenuator to correct each light reception output from each of the output terminals with the output setting circuit depending on an output difference generated in each light reception output from each of the output terminals based on a position of a light reception spot projected on the light reception region. According to this, each light reception output is corrected and derived from the photo detector by the single optical pickup unit. Particularly, since each light reception output from each output terminal of the photo detector is corrected based on the position of the light reception spot projected on the light reception region, each light reception output can be derived by correcting inequality of each light reception output of the photo detector generated by the bias of the light reception spot projected on the light reception region with the single optical pickup unit.

In the light reception output controlling apparatus according to the present invention, the optical pickup unit is disposed with the control circuit that supplies the output setting circuit with setting data for setting each light reception output from each output terminal and is disposed with a memory circuit that stores the setting data for setting each light reception output from each output terminal with the output setting circuit to correct each light reception output from each output terminal based on the setting data stored in the memory circuit. According to this, since the setting data stored in the memory circuit is read by the control circuit disposed in the optical pickup unit and the setting is performed based on the setting data for each light reception output from each output terminal of the photo detector, each light reception output can be corrected and derived from the photo detector based on the setting data stored in the memory circuit with the single optical pickup unit by storing the setting data for correcting each light reception output of the photo detector correspondingly to each optical pickup unit.

In the light reception output controlling apparatus according to the present invention, the control circuit is disposed in a semiconductor integrated circuit constituting the photo detector, and the control circuit reads the setting data stored in the memory circuit and transfers the setting data to the photo detector. The control circuit is disposed in a semiconductor integrated circuit constituting the memory circuit, and the control circuit reads the setting data stored in the memory circuit and transfers the setting data to the photo detector. According to this, since the control circuit is disposed in the semiconductor integrated circuit constituting the photo detector or the semiconductor integrated circuit constituting the memory circuit in consideration of the circuit scale of the control circuit, another semiconductor integrated circuit is not needed for the control circuit, which is advantageous for disposing the optical pickup unit.

In the light reception output controlling apparatus according to the present invention, the optical pickup unit employing the astigmatic method for the focus control writes into the memory circuit the setting data for adjusting each light reception output from each of the output terminal based on each light reception output acquired at the time of an inspection process that inspects each light reception output from each segment of the light reception region after the attachment process of the photo detector, and each light reception output from each of the output terminals is adjusted by reading the setting data in the completed optical pickup unit to correct each light reception output derived from the photo detector. According to this, since the setting data is written into the memory circuit to adjust each light reception output of the photo detector based on each light reception output of the photo detector, which is acquired at the time of the inspection process, each light reception output derived from the photo detector can be corrected with the accuracy of the inspection process in the completed optical pickup unit.

In the light reception output controlling apparatus according to the present invention, the setting data of the memory circuit is read at the time of start-up when a power supply voltage is applied, and each light reception output from each of the output terminals are automatically corrected at the time of start-up by controlling the output setting circuit based on the setting data to set each light reception output from each output terminal of the photo detector. According to this, each light reception output derived from each output terminal of the photo detector can be automatically corrected with the single optical pickup unit at the time of start-up.

In the light reception output controlling apparatus according to the present invention, when a focus error signal for determining that a laser beam irradiated to a disk is focused on a signal layer of the disk, is generated, each light reception output from each output terminal of the photo detector is set by the output setting circuit so as to equalize a value of each addition signal acquired by adding each light reception output from each segment of the light reception region of the photo detector for each region divided in two at least by a dividing line corresponding to a direction orthogonal to a tracking direction. According to this, the inequality is corrected in each light reception output for each region divided in two by the dividing line corresponding to the direction orthogonal to the tracking direction. According to this, the inequality is corrected in each light reception output for each region divided in two by the dividing line corresponding to the direction orthogonal to the tracking direction; the amplitude characteristics of the wobble signal can be improved; and the tracking servo characteristics can be improved when the employed tracking control mode is the push-pull method and the differential push-pull method, which is the application thereof.

In the light reception output controlling apparatus according to the present invention, in the optical pickup unit employing the astigmatic method for the focus control to focus the laser light irradiated to the disk on the signal layer of the disk, the focal point of the laser beam irradiated to the disk is moved back and forth, and each light reception output from each output terminal is set by the output setting circuit so as to equalize a peak of a value of each addition signal acquired by adding each light reception output from each output terminal for each region of the light reception region of the photo detector divided in two by the dividing line corresponding to the direction orthogonal to the tracking direction on this occasion. The detection accuracy of each light reception output is improved for each region divided in two by the dividing line corresponding to the direction orthogonal to the tracking direction with the use of the peak value of each of the addition signal. According to this, since the peak is equalized in the value of each addition signal acquired by adding each light reception output of the photo detector for each region divided in two by the dividing line corresponding to the direction orthogonal to the tracking direction, the detection accuracy of each light reception output is improved for each region divided in two by the dividing line corresponding to the direction orthogonal to the tracking direction and the inequality can be corrected accurately in each light reception output for each region.

In the light reception output controlling apparatus according to the present invention, the focal point of the laser beam irradiated to the disk is moved back and forth, and each light reception output from each output terminal is set by the output setting circuit so as to equalize the peak of the value of each addition signal acquired by adding each light reception output from each output terminal for each region of the light reception region of the photo detector divided in two by the dividing line corresponding to the tracking direction on this occasion.

In the light reception output controlling apparatus according to the present invention, each light reception output from each output terminal is corrected to maintain a total light reception output corresponding to a total light amount acquired by summing each light reception output approximately constant when setting each light reception output from each output terminal of the photo detector with the output setting circuit depending on an output difference generated in each light reception output from each output terminal. According to this, since each light reception output from each of the output terminals is corrected to maintain the total light reception output corresponding to the total light amount acquired by summing each light reception output approximately constant, both the S/N and the margin of each light reception output can be appropriately ensured.

BRIEF DESCRIPTION OF THE DRAWINGS

To understand the present invention and the advantages thereof more thoroughly, the following description should be referenced along with the accompanying drawings.

DETAILED DESCRIPTION OF THE INVENTION

From the contents of the description and the accompanying drawings, at least the following details will be apparent.

Figure 1:
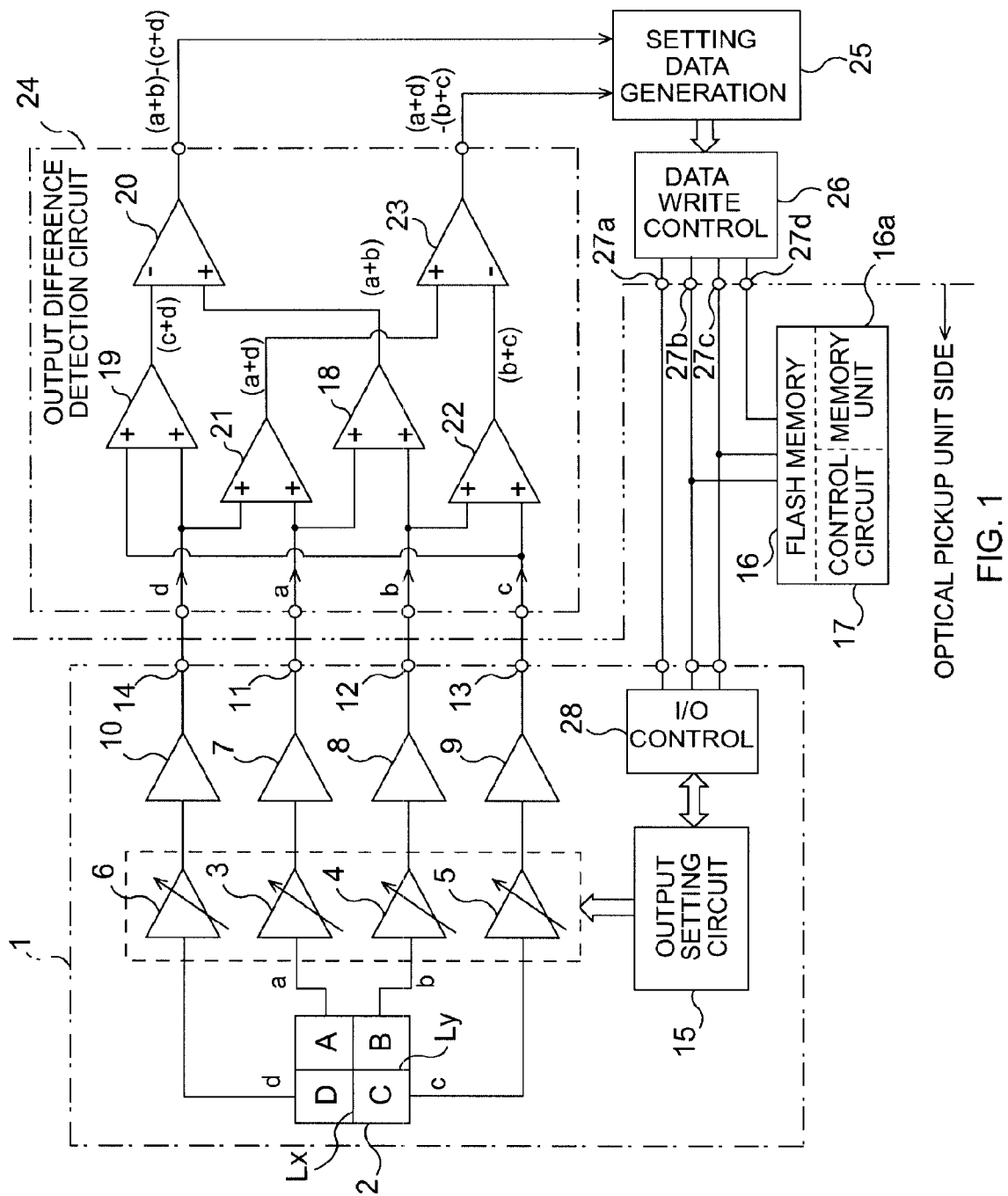
FIG. 1 is a circuit block diagram of one embodiment of a light reception output controlling apparatus of a photo detector in an optical pickup unit according to the present invention.

FIG. 1 is a circuit block diagram of one embodiment of a light reception output controlling apparatus of a photo detector in an optical pickup unit according to the present invention.

Figure 2:
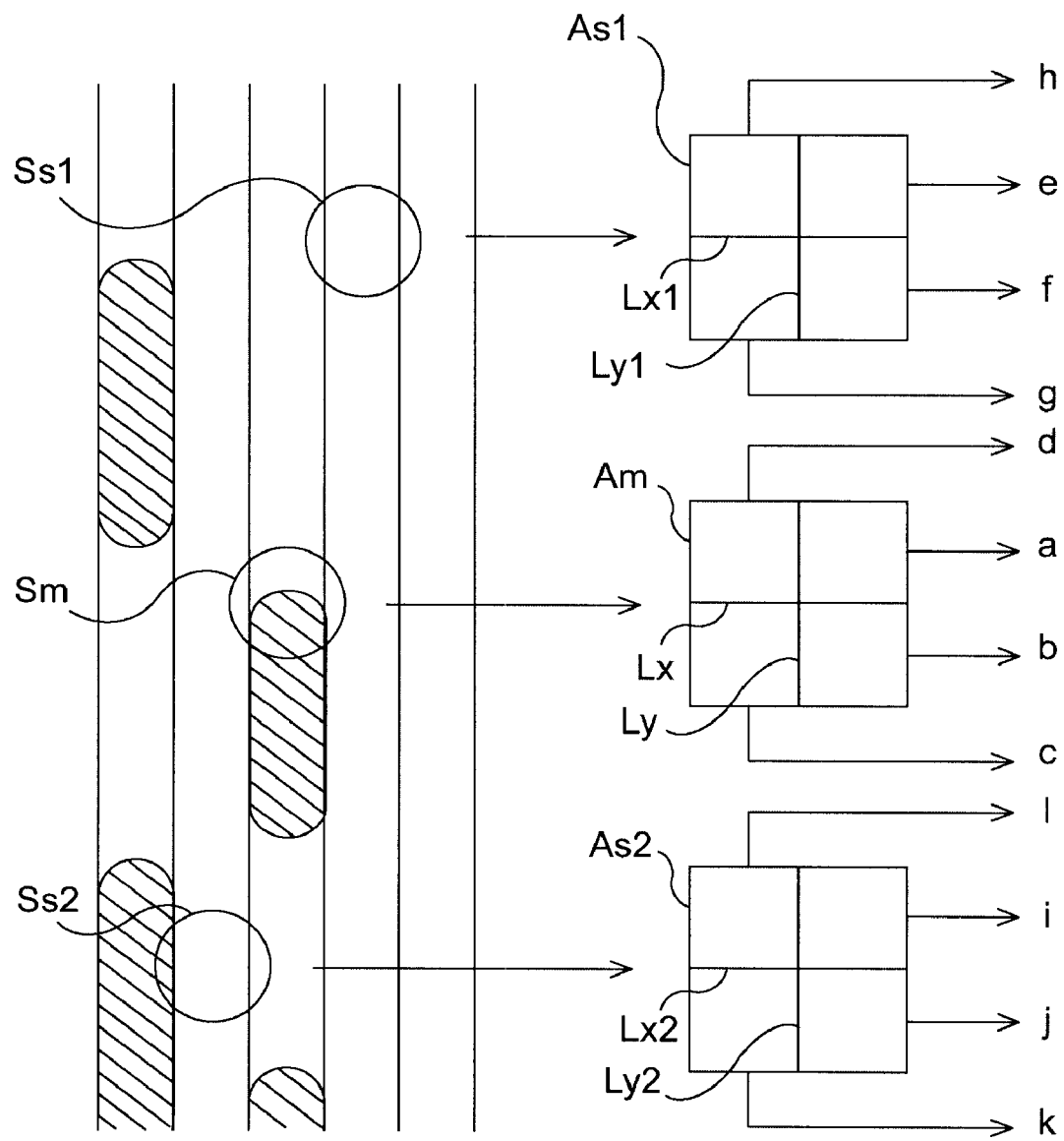
FIG. 2 is an explanatory diagram for describing a focus control mode and a tracking control mode, showing the light reception regions of the photo detector and the light spot arrangement on the disk.

FIG. 2 is an explanatory diagram for describing a focus control mode and a tracking control mode. FIG. 2 shows light reception regions corresponding to an optical pickup unit employing the phase difference method for DVD-ROM and the differential push-pull method for DVD±R/RW and CD with regard to the tracking control mode and employing the astigmatic method for the various record/reproduction CD and the differential astigmatic method for various record/reproduction DVD with regard to the focus control mode and the arrangement of the light spot of the laser beam emitted from the optical pickup unit to the disk.

Although not shown because of irrelevance to the gist, the laser beam is emitted from a laser diode that is a light source of the optical pickup unit, and the laser beam is diffracted by a diffraction grating to a 0th-order diffracted laser beam (main beam) and ±1st-order diffracted laser beams (forward sub beam and backward sub beam) and divided into three beams. The three beams pass through a predetermined optical system, are guided by an objective lens, are converged by the objective lens, and are irradiated to the disk.

The three beams are reflected by the disk, returned to the objective lens, separated to light paths different from the outward paths in the middle of the light path, and guided to the photo detector.

With regard to three beams irradiated to the disk, as shown in FIG. 2, a main spot Sm of the 0th-order diffracted laser beam is located at a center of a signal track, and each sub spot Ss1, Ss2 of the ±1st-order diffracted laser beams is located at a center of an adjacent signal track in the direction different from the signal track where the main spot is on the track.

Each of a main light reception region Am and sub light reception regions As1 and As2 is divided into four by two dividing lines orthogonal to each other in a cross shape, is constituted by four segments, and is arranged vertically on the light reception surface of the photo detector, and the main light reception region Am and the sub light reception regions As1 and As2 receive reflected laser beams reflected by the disk, i.e., the 0th-order diffracted laser beam, the +1st-order diffracted laser beam, and −1st-order diffracted laser beam, respectively.

Since the basic version and the applied version of the astigmatic method is employed in the focus control for CD and DVD, respectively, the photo detector receives a laser beam added with astigmatism by an astigmatism generating optical system, and an angle of 45 degrees is formed by each of dividing lines Lx, Ly of the main light reception region Am and dividing lines Lx1, Ly1, Lx2, Ly2 of the sub light reception regions As1 and As2 of the photo detector relative to the generation direction of the astigmatism of the received laser beam.

The dividing line Ly of the main light reception region Am and the dividing lines Ly1 and Ly2 of the sub light reception regions As1 and As2 are set to the signal track direction of the disk projected on the photo detector in consideration of the employed tracking control mode.

Assuming each light reception output obtained from each segment constituting the main light reception region Am and the sub light reception regions As1 and As2 is a, b, c, d, e, f, g, h, I, j, k, and l, in the phase difference method employed for the tracking control of the reproduction of the DVD-ROM, a phase difference is detected for each sum signal (a+c), (b+d) acquired by adding the light reception outputs of the segment in each diagonal direction of the main light reception region Am or a phase difference is detected for the light reception outputs a, b or b, c of predetermined two adjacent segments divided by the dividing line Lx in the signal track direction of the main light reception region Am to acquire the tracking error signal.

In the differential push-pull method employed for the tracking control of the recording of DVD+R/RW and the recording/reproducing of CD, a main push-pull signal is calculated which is a difference signal between sum signals acquired by adding each light reception signal of two segments divided by the dividing line Lx in the signal track direction of the main light reception region Am; sub push-pull signals, i.e., first and second sub push-pull signals for the sub light reception regions As1 and As2 are calculated which are difference signals between sum signals acquired by adding each light reception signal of two segments divided by the dividing lines Lx1 and Lx2 in the signal track direction of sub light reception regions As1 and As2; gain (G1) adjustment is performed for a combined sub push-pull signal acquired by combining the first and second push-pull signals in accordance with the main push-pull signal; and a difference of these push-pull signals is calculated to obtain the tracking error signal which is a computing equation a−b−c+d−G1(e−f−g+h+i−j−k+l).

In the astigmatic method employed for the focus control of various record/reproduction CD, two sum signals are acquired by adding each light reception output of each segment of the main light reception region Am for segments arranged on each diagonal line, and a difference signal between the sum signals is calculated to acquire the focus error signal that is a main astigmatic signal of a computing equation a+c−(b+d).

In the difference astigmatic method employed for the focus control of various record/reproduction DVD, each sub astigmatic signal of each sub light reception region As1 and As2 is acquired also for each sub light reception region As1 and As2 as is the case with the main light reception region Am of the astigmatic method; the gain (G2) adjustment is performed in accordance with the main astigmatic signal for addition to the main astigmatic signal; and the focus error signal is acquired from a computing equation a+c−(b+d)+ G2(e−f+g−h+i−j+k−l).

Description will be made of the light reception output controlling apparatus of the photo detector in the optical pickup unit according to the present invention with reference to FIG. 1.

A light reception region 2 of a photo detector 1 shown in FIG. 1 corresponds to the main light reception region Am of FIG. 2, and each segment A, B, C, D of the light reception region 2 generates each light reception output a, b, c, d depending on the light reception amount of the received laser beam.

The photo detector 1 is constituted by so-called PDIC (Photo detector integrated circuit) that is a semiconductor integrated circuit and attached to an optical housing into which optical devices of the optical pickup unit are incorporated except an objective lens.

The photo detector 1 includes each current/voltage conversion amplifier 3, 4, 5, 6 that converts and amplifies each light reception output a, b, c, d from each segment A, B, C, D of the light reception region 2 from a current signal to a voltage signal and each subsequent amplifier 7, 8, 9, 10 that amplifies each light reception output a, b, c, d converted to the voltage signal by each current/voltage conversion amplifier 3, 4, 5, 6 for outputting from each output terminal 11, 12, 13, 14.

In each current/voltage conversion amplifier 3, 4, 5, 6, the gain can be selectively and independently adjusted by switching a plurality of feedback resistances with different resistance values, and each gain of the current/voltage conversion amplifiers 3, 4, 5, 6 is set by selecting the utilized feedback resistance by an output setting circuit 15 included in the PDIC constituting the photo detectors.

Figure 3:
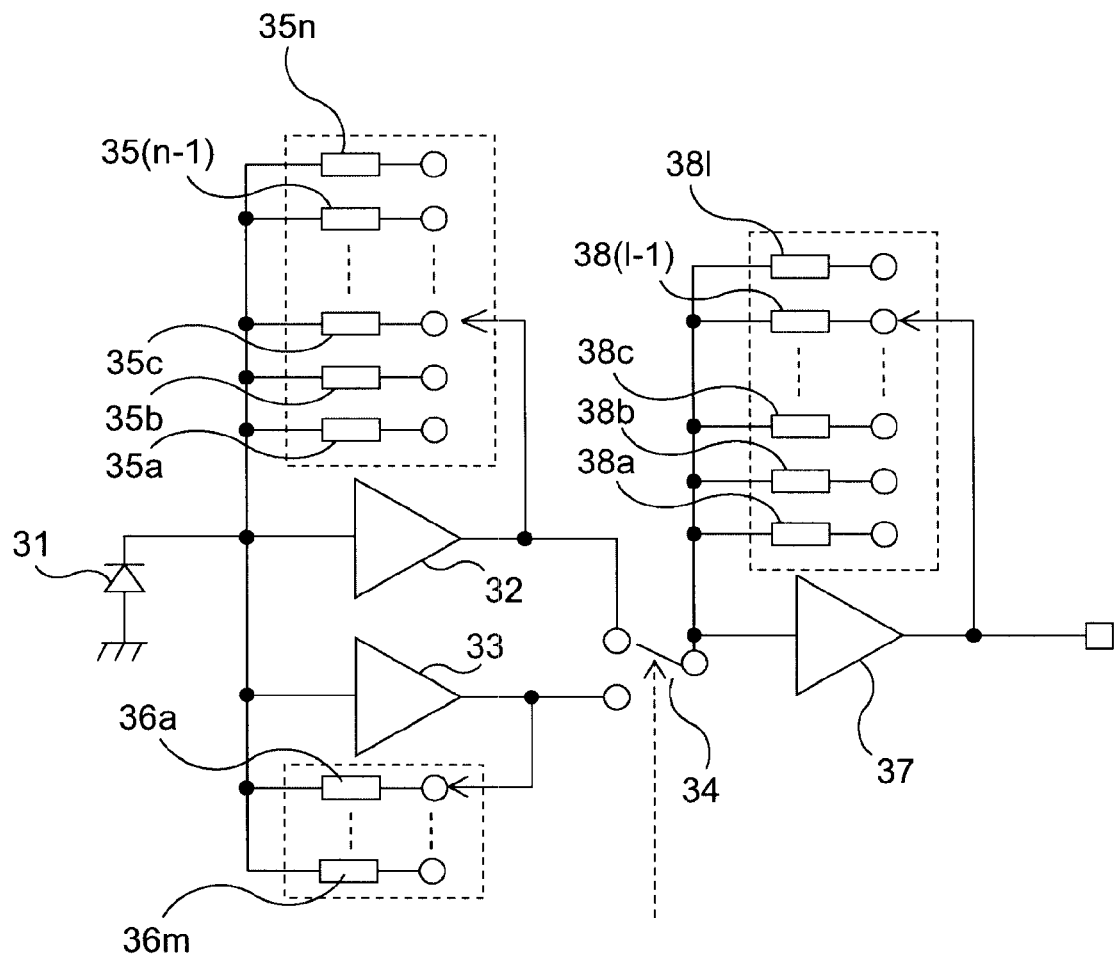
FIG. 3 is a circuit diagram of an example of current/voltage conversion amplifiers and a subsequent amplifier for one segment in PDIC.

FIG. 3 is a circuit diagram of an example of the current/voltage conversion amplifiers and the subsequent amplifier for one segment in the PDIC. In this example, the current/voltage conversion amplifiers 32, 33 of two systems are disposed for one segment 31, and the current/voltage conversion amplifier of one predetermined system selectively used by a switch circuit 34 depending on the disk type and the mode type of the recording and reproducing. The current/voltage conversion amplifiers 32 and 33 of each system are connected with a plurality of feedback resistances 35a, 35b, 35c . . . 35 (n−1), 35n and 36a . . . 36m, and a predetermined feedback resistance is selected by the switch circuit depending on the gain set by the output setting circuit.

The subsequent amplifier 37 is selectively connected with a predetermined feedback resistance of a plurality of feedback resistances 38a, 38b, 38c . . . 38(l−1), 38l, and variations are corrected in each of the light reception output in the initial state before correcting the gain with the current/voltage conversion amplifier by selecting a predetermined feedback resistance for each light reception output from each output terminal corresponding to each segment A, B, C, D of the light reception region 2.

Since the gain correction in the current/voltage conversion amplifier is independent from the variation correction of each light reception output in the initial state, the gain correction in the current/voltage conversion amplifier is facilitated.

By the way, the optical pickup unit includes a flash memory 16 connected to the photo detector and includes a control circuit 17 within the semiconductor integrated circuit constituting the flash memory to control input/output of setting data for setting each light reception output from each output terminal. That is, the flash memory 16 includes a memory unit 16a storing data and a control circuit 17.

The setting data stored in the memory unit 16a of the flash memory 16 are read by the control circuit 17, and each gain of each current/voltage conversion amplifier 3, 4, 5, 6 is set by the output setting circuit 15 depending on the setting data to set each light reception output that is output from each output terminal 11, 12, 13, 14 of the photo detector 1.

The control circuit 17 reads the setting data from the flash memory 16 at the time of start-up when a power supply voltage is applied and sets the gain of each current/voltage conversion amplifier 3, 4, 5, 6 based on the setting data.

On the other hand, if the setting data cannot be read from the flash memory 16, the gain of the each current/voltage conversion amplifier 3, 4, 5, 6 is set to the default setting. In the default setting, for example, the gain of each current/voltage conversion amplifier 3, 4, 5, 6 is set to 0 dB, which is at the midpoint of the adjustable range, in all the segments of the light reception region.

The setting data written into the flash memory 16 are setting data for adjusting each light reception output from each output terminal 11, 12, 13, 14 based on each light reception output acquired at the time of an inspection process before factory shipment that moves the focal point of the laser beam irradiated to the disk back and forth to inspect each light reception output from each output terminal 11, 12, 13, 14 of the photo detector 1 on this occasion, after the attachment process that positions and attaches the photo detector 1 to the optical housing of the optical pickup unit in the direction orthogonal to the light axis and after the annealing process for alleviating a remaining stress by a heat treatment depending on a material of members constituting the optical pickup unit and an adhesive bonding each component.

In the position adjustment of the photo detector 1, the laser spot projected on the light reception region of the photo detector 1 is located correctly when the laser spot is focused on the disk so as to match each light reception output from each output terminal 11, 12, 13, 14 corresponding to each segment.

Each light reception output acquired at the time of the inspection process inspecting each light reception output from each output terminal 11, 12, 13, 14 of the photo detector 1 is calculated by an output difference detection circuit 24 of FIG. 1, for example. The output difference detection circuit 24 is constituted by: a first addition amplifier 18 that adds the light reception outputs a and b corresponding to the segments A and B, which are output from the output terminals 11 and 12, respectively, to acquire a first addition signal (a+b); a second addition amplifier 19 that adds the light reception outputs c and d corresponding to the segments C and D, which are output from the output terminals 13 and 14, respectively, to acquire a second addition signal (c+d); a first subtraction amplifier 20 that acquires a first difference signal {(a+b)−(c+d)} between the first addition signal (a+b) and the second addition signal (c+d); a third addition amplifier 21 that adds the light reception outputs a and d corresponding to the segments A and D, which are output from the output terminals 11 and 14, respectively, to acquire a third addition signal (a+d); a fourth addition amplifier 22 that adds the light reception outputs b and c corresponding to the segments B and C, which are output from the output terminals 12 and 13, respectively, to acquire a fourth addition signal (b+c); and a second subtraction amplifier 23 that acquires a second difference signal {(a+d)−(b+c)} between the third addition signal (a+d) and the fourth addition signal (b+c).

That is, when the light reception region 2 is divided into two regions by the dividing line Lx corresponding to the direction orthogonal to the tracking direction of the light reception region 2, the output difference detection circuit 24 calculates each addition signal (a+b), (c+d) acquired by adding each light reception output a, b from each segment A, B of one region and each light reception output c, d from each segment C, D of the other region for each region and further calculates the first difference signal {(a+b)−(c+d)} that is a voltage difference of the addition signals to detect a light reception output difference of the regions arranged in the Y-direction (signal track direction) divided by the dividing line Lx of the light reception region 2 and to detect an output difference in the Y-direction of the light reception spot.

When the light reception region 2 is divided into two regions by the dividing line Ly corresponding to the tracking direction of the light reception region 2, the output difference detection circuit 24 calculates each addition signal (a+d), (b+c) acquired by adding each light reception output a, d from each segment A, D of one region and each light reception output b, c from each segment B, C of the other region for each region and further calculates the second difference signal {(a+d)−(b+c)} that is a voltage difference of the addition signals to detect a light reception output difference of the regions arranged in the X-direction (tracking direction) divided by the dividing line Ly of the light reception region 2 and to detect an output difference in the X-direction of the light reception spot.

The first difference signal {(a+b)−(c+d)} from the first subtraction amplifier 20 and the second difference signal {(a+d)−(b+c)} from the second subtraction amplifier 23 are the output difference in the Y-direction of the light reception region 2 and the output difference in the X-direction of the light reception region 2, respectively, which are calculated by the output difference detection circuit 24, and are supplied to a setting data generation circuit 25, and the setting data generation circuit 25 generates the setting data for controlling the output setting circuit 15 such that the first difference signal {(a+b)−(c+d)} and the second difference signal {(a+d)−(b+c)} become "0".

That is, since the direction and distance of the displacement in the Y-direction of the light reception spot received by the light reception region 2 can be known from the polarity and voltage value of the first difference signal {(a+b)−(c+d)}, the setting data generation circuit 25 generates the setting data depending on the polarity and voltage value of the first difference signal {(a+b)−(c+d)} and, based on the setting data, the output setting circuit 15 adjusts the gains of each current/voltage conversion amplifier 3, 4 that amplifies each light reception output a, b from the segments A, B related to the displacement in the Y-direction of the light reception spot and each current/voltage conversion amplifier 5, 6 that amplifies each light reception output c, d from the segments C, D relatively to make the first difference signal {(a+b)−(c+d)} become "0".

Since the direction and distance of the displacement in the X-direction of the light reception spot received by the light reception region 2 can be known from the polarity and voltage value of the second difference signal {(a+d)−(b+c)}, the setting data generation circuit 25 generates the setting data depending on the polarity and voltage value of the second difference signal {(a+d)−(b+c)} and, based on the setting data, the output setting circuit 15 adjusts the gains of each current/voltage conversion amplifier 3, 6 that amplifies each light reception output a, d from the segments A, D related to the displacement in the X-direction of the light reception spot and each current/voltage conversion amplifier 4, 5 that amplifies each light reception output b, c from the segments B, C relatively to make the second difference signal {(a+d)−(b+c)} become "0".

In this way, when the first difference signal {(a+b)−(c+d)} and the second difference signal {(a+d)−(b+c)} are set to "0", to maintain the total light reception output (a+b+c+d) corresponding to the total light amount acquired by summing each light reception output a, b, c, d from each output terminal 11, 12, 13, 14 approximately constant with the output setting circuit 15 depending on the setting data generated by the setting data generation circuit 25, the gain is adjusted to be increased in the amplifier corresponding to the segment with a lower comparison target light reception output and the gain is adjusted to be decreased in the amplifier corresponding to the segment with a higher comparison target light reception output to correct each light reception output a, b, c, d.

By setting both the first difference signal {(a+b)−(c+d)} and the second difference signal {(a+d)−(b+c)} to "0", the output differences can be eliminated in the Y-direction (signal track direction) divided in two by the dividing line Lx of the light reception region 2 and in the X-direction (tracking direction) divided in two by the dividing line Ly of the light reception region 2, and the influence of the bias in the Y-direction and the X-direction is eliminated from the light reception spot on the light reception region 2 to equalize each light reception output a, b, c, d from each output terminals 11, 12, 13, 14 of the photo detector 1.

Although both the first difference signal {(a+b)−(c+d)} and the second difference signal {(a+d)−(b+c)} are set to "0" in this case, it is also effective to set only predetermined one of these difference signals to "0". Particularly, when the first difference signal {(a+b)−(c+d)} is set to "0", the output difference in the Y-direction is eliminated and this is effective to improve the tracking servo characteristics and to detect the wobble signal.

When the setting data generated by the setting data generation circuit 25 are supplied directly to the output setting circuit 15 without passing through the flash memory 16, a data write control circuit 26 applies an active voltage enabling the direct supply to a direct control terminal 27a of the optical pickup unit and supplies the setting data to a data terminal 27b and a reference clock synchronizing the setting data to a clock terminal 27c.

On the other hand, when the setting data generated by the setting data generation circuit 25 are written into the flash memory 16, the data write control circuit 26 applies a predetermined voltage enabling the writing into the flash memory 16 to a mode terminal 27d of the optical pickup unit and supplies the setting data to the data terminal 27b and a reference clock synchronizing the setting data to the clock terminal 27c. In this case, a three-valued voltage is applied to the mode terminal 27d to switch the operation modes of the flash memory 16; a high voltage (12V) achieves a write mode for writing the setting data into the flash memory 16; a medium voltage (5V) achieves a read mode for reading the setting data stored in the flash memory 16 for confirmation, etc.; and a low voltage (0V) achieves an operation stop mode for terminating the operation of the flash memory 16 for power saving.

The adjustment for setting the first difference signal {(a+b)−(c+d)} and the second difference signal {(a+d)−(b+c)} to "0" is performed while the focus error signal {(a+c)−(b+d)} is "0", i.e., while the laser beam emitted from the optical pickup unit to the disk is focused on the disk.

If the focus error signal {(a+c)-(b+d)} is set to "0" while the light reception spot of the light reception region 2 of the photo detector is biased and each light reception output a, b, c, d from each output terminal 11, 12, 13, 14 is not equal, it is determined that the laser light is not focused correctly on the disk and, therefore, if both the first difference signal {(a+b)−(c+d)} and the second difference signal {(a+d)−(b+c)} are set to "0", this may be insufficient for equalizing each light reception output a, b, c, d because of the influence of the bias of the light reception spot on the light reception region.

Therefore, by moving the focal point of the laser beam irradiated to the disk back and forth and determining that the average value of the peak and bottom of the focus error signal is in the state of focusing the laser beam on the disk, the focal point of the laser beam is fixed to the average value to adjust the first difference signal {(a+b)−(c+d)} and/or the second difference signal {(a+d)−(b+c)} to "0". This alleviates the biasing influence of the light reception spot of the light reception region in the photo detector 1.

In application of the determination that the average value of the peak and bottom of the focus error signal is in the state of focusing the laser beam on the disk, the first difference signal {(a+b)−(c+d)} and/or the second difference signal {(a+d)−(b+c)} are divided by a total light amount signal (a+b+c+d) of the laser beam, which is acquired by summing each light reception output a, b, c, d corresponding to each segment of the light reception region 2 derived from the photo detector 1 to use a proportion signal {(a+b)−(c+d)}/(a+b+c+d) indicating a proportion of the first difference signal and/or a proportion signal {(a+d)−(b+c)}/(a+b−c+d) indicating a proportion of the first difference signal. By using these proportion signals, the total light amount of the received laser beam is less fluctuated by the influence of moving the focal point of the laser beam irradiated to the disk back and forth.

With regard to the values of the addition signal (a+b) and the addition signal (c+d) calculated in the course of acquiring the first difference signal {(a+b)−(c+d)} and/or the values of the addition signal (a+d) and the addition signal (b+c) calculated in the course of acquiring the second difference signal {(a+d)−(b+c)} by moving the focal point of the laser beam irradiated to the disk back and forth, equalizing the peaks of the values is equivalent to the adjustment of the first difference signal {(a+b)−(c+d)} and/or the second difference signal {(a+d)−(b+c)} to "0" without the influence of the error between the focus error signal {(a+c)−(b+d)}=0 and the focal point of the laser beam on the disk due to the bias of the light reception spot on the light reception region 2, and this is effective to reduce adverse affects of each light reception output that is not equalized due to the bias of the light reception spot.

The output difference in each light reception output a, b, c, d from each output terminal 11, 12, 13, 14 of the photo detector 1 is generated due to the bias of the light reception spot on the light reception region 2 in the aforementioned various methods and is detected as an output difference signal by the output difference detection circuit 24. The setting data generation circuit 25 generates the setting data for controlling the output setting circuit 15 based on the output difference signal, and the data write control circuit 26 selectively applies a high voltage to the mode terminal 27d to set the flash memory 16 to the write mode and performs the control for transferring and writing the setting data generated by the setting data generation circuit 25 into the flash memory 16. The data write control circuit 26 selectively applies a predetermined voltage to the direct control terminal 27a to transfer the setting data generated by the setting data generation circuit 25 directly to the photo detector 1 and supplies the setting data to the output setting circuit 15 via an input/output control circuit 28.

When the setting data generated by the setting data generation circuit 25 are transferred to the output setting circuit 15 directly or via an input/output control circuit 28 after the setting data are written into and read from the flash memory 16, the output setting circuit 15 sets the gain of the target amplifier of the current/voltage conversion amplifiers 3, 4, 5, 6 depending on the setting data.

The setting data generation circuit 25 calculates an adjustment value for adjusting the gain of the target amplifier of the current/voltage conversion amplifiers 3, 4, 5, 6 depending on the polarity and voltage level of the output difference signal so as to set the output difference signal to "0" and generates the setting data for setting the gain of the target amplifier of the current/voltage conversion amplifiers 3, 4, 5, 6 based on the adjustment value. The setting data generation circuit 25 generates the setting data for setting the gain of each current/voltage conversion amplifier 3, 4, 5, 6 to correct each light reception output a, b, c, d while maintaining the total light reception output (a+b+c+d) corresponding to the total Light amount acquired by summing each light reception output a, b, c, d from each output terminal 11, 12, 13, 14 approximately constant. Therefore, by setting the gain of each current/voltage conversion amplifier 3, 4, 5, 6 depending on the setting data with the output setting circuit 15, the output difference signal detected by the output difference detection circuit 24 becomes "0" in an equalized manner, and the total light reception output (a+b+c+d) corresponding to the total light amount acquired by summing each light reception output a, b, c, d from each output terminal 11, 12, 13, 14 is maintained approximately constant before and after the correction.

If the output difference signal cannot be set to "0" in an equalized manner by setting the amplifier gain once with the output setting circuit 15, the setting data generation circuit 25 repeatedly generates the setting data for changing the gain setting of each current/voltage conversion amplifier 3, 4, 5, 6 to finally generate the setting data for setting the output difference signal to "0".

In the case of the output difference detection circuit 24 shown in FIG. 2, the output setting circuit 15 sets the gain of each current/voltage conversion amplifier 3, 4, 5, 6 depending on the setting data generated by the setting data generation circuit 25 to set the first difference signal {(a+b)−(c+d)} to "0", and each light reception output a, b, c, d derived from each output terminal 11, 12, 13, 14 is adjusted to set the second difference signal {(a+d)−(b+c)} to "0".

When the first difference signal {(a+b)−(c+d)} is set to "0", if the polarity of the first difference signal is positive, the gains of the current/voltage conversion amplifiers 5, 6 are increased to increase the voltage levels of the light reception outputs c, d from the output terminals 13, 14; the gains of the current/voltage conversion amplifiers 3, 4 are reduced to reduce the voltage levels of the light reception outputs a, b from the output terminals 11, 12; and the gain of each current/voltage conversion amplifier 3, 4, 5, 6 is set so as to maintain the total light reception output (a+b+c+d) corresponding to the total light amount acquired by summing each light reception output a, b, c, d from each output terminal 11, 12, 13, 14 approximately constant.

If the polarity of the first difference signal is negative, the gains of the current/voltage conversion amplifiers 3, 4 are increased to increase the voltage levels of the light reception outputs a, b from the output terminals 11, 12; the gains of the current/voltage conversion amplifiers 5, 6 are reduced to reduce the voltage levels of the light reception outputs c, d from the output terminals 13, 14; and the gain of each current/voltage conversion amplifier 3, 4, 5, 6 is set so as to maintain the total light reception output (a+b+c+d) corresponding to the total light amount acquired by summing each light reception output a, b, c, d from each output terminal 11, 12, 13, 14 approximately constant.

Similarly, when the second difference signal {(a+d)−(b+c)} is set to "0", if the polarity of the second difference signal is positive, the gains of the current/voltage conversion amplifiers 4, 5 are increased to increase the voltage levels of the light reception outputs b, c from the output terminals 12, 13; the gains; of the current/voltage conversion amplifiers 3, 6 are reduced to reduce the voltage levels of the light reception outputs a, d from the output terminals 11, 14; and the gain of each current/voltage conversion amplifier 3, 4, 5, 6 is set so as to maintain the total light reception output (a+b+c+d) corresponding to the total light amount acquired by summing each light reception output a, b, c, d from each output terminal 11, 12, 13, 14 approximately constant.

If the polarity of the second difference signal is negative, the gains of the current/voltage conversion amplifiers 3, 6 are increased to increase the voltage levels of the light reception outputs a, d from the output terminals 11, 14; the gains of the current/voltage conversion amplifiers 4, 5 are reduced to reduce the voltage levels of the light reception outputs b, c from the output terminals 12, 13; and the gain of each current/voltage conversion amplifier 3, 4, 5, 6 is set so as to maintain the total light reception output (a+b+c+d) corresponding to the total light amount acquired by summing each light reception output a, b, c, d from each output terminal 11, 12, 13, 14 approximately constant.

When the output difference signal calculated by the output difference detection circuit 24 is set to "0" in an equalized manner, the output setting circuit 15 writes the setting data for setting the gain of each light reception output a, b, c, d into the flash memory 16 with the data write control circuit 26.

The setting data are written into the flash memory 16 before the factory shipment of the optical pickup unit, and the output difference detection circuit 24, the setting data generation circuit 25, and the data write control circuit 26 are detached from the optical pickup unit at the time of the factory shipment of the optical pickup unit.

After the setting data are written into the flash memory 16, the mode terminal 27d or the direct control terminal 27a, the data terminal 27b, and the clock terminal 27c disposed on the optical pickup unit are used at the time of the service operation for writing the new setting data into the flash memory 16 or checking the setting data stored in the flash memory 16 if the setting data in the flash memory 16 are lost or if the error of the setting data is increased.

The memory circuit storing the setting data is not limited to the flash memory 16 and may preferably be EEPROM (Electronically Erasable and Programmable Read Only Memory), RAM, etc., into which the setting data can be written electrically.

While the optical pickup unit is mounted to the disk drive, if a power supply voltage is applied to the optical pickup unit at the time of the power-on of the disk drive, the control circuit 17 included in the flash memory 16 is operated to read the setting data stored in the flash memory 16, and the setting data are supplied to the photo detector 1 along with the clock.

The setting data are supplied to the output setting circuit 15 via the input/output control circuit 28 in the photo detector 1 and the output setting circuit 15 sets the gain of each current/voltage conversion amplifier 3, 4, 5, 6 based on the setting data.

As a result, the voltage difference is eliminated in each light reception output from each output terminal 11, 12, 13, 14 of the photo detector 1; the influence is eliminated for the bias in the Y-direction and X-direction of the light reception spot on the light reception region 2; and each light reception output a, b, c, d from each output terminal 11, 12, 13, 14 of the photo detector 1 is equalized (set within the allowable range than can be considered equivalent).

By the way, the light reception output controlling apparatus of the photo detector in the aforementioned optical pickup unit includes the direct control terminal 27a, and the gain of each current/voltage conversion amplifier 3, 4, 5, 6 is set based on the setting data by applying a predetermined voltage signal to the direct control terminal 27a, inputting the setting data to the data terminal 27b, and inputting the data transfer clock to the clock terminal 27c. Therefore, when the disk drive provides the signals supplied to the direct control terminal 27a, the direct control terminal 27a, and the clock terminal 27c, each light reception output a, b, c, d from each output terminal 11, 12, 13, 14 of the photo detector 1 can be corrected by the control from the disk drive.

Although in the light reception output controlling apparatus of the photo detector in the optical pickup unit shown in FIG. 1, the flash memory 16 is disposed with the control circuit 17 that dominantly controls the input/output of the setting data partially because the semiconductor integrated circuit is easily fabricated, this is not a limitation and, from the standpoint of a circuit scale, the photo detector 1 can include the control circuit 17 without any problem.

If the differential astigmatic method is employed for the focus control or the differential push-pull method is employed for the tracking control, as is the case with the aforementioned main light reception region Am, in each sub light reception region As1 and As2 (see FIG. 2) of the photo detector that receives each sub beam before and after the main beam, it is preferable to equalize each light reception output from each output terminal of the photo detector 1, which corresponds to each element of the sub light reception region As1, and to equalize each light reception output from each output terminal of the photo detector 1, which corresponds to each element of the sub light reception region As2. In this way, the accuracy is improved in the focus error signal and the tracking error signal.

Although the light reception output controlling apparatus of the photo detector in the optical pickup unit shown in FIG. 1 sets the gain of each current/voltage conversion amplifier to correct each light reception output from each output terminal of the photo detector, this is not a limitation and the correction may preferably be achieved by setting the gain of each subsequent amplifier.

Figure 4:
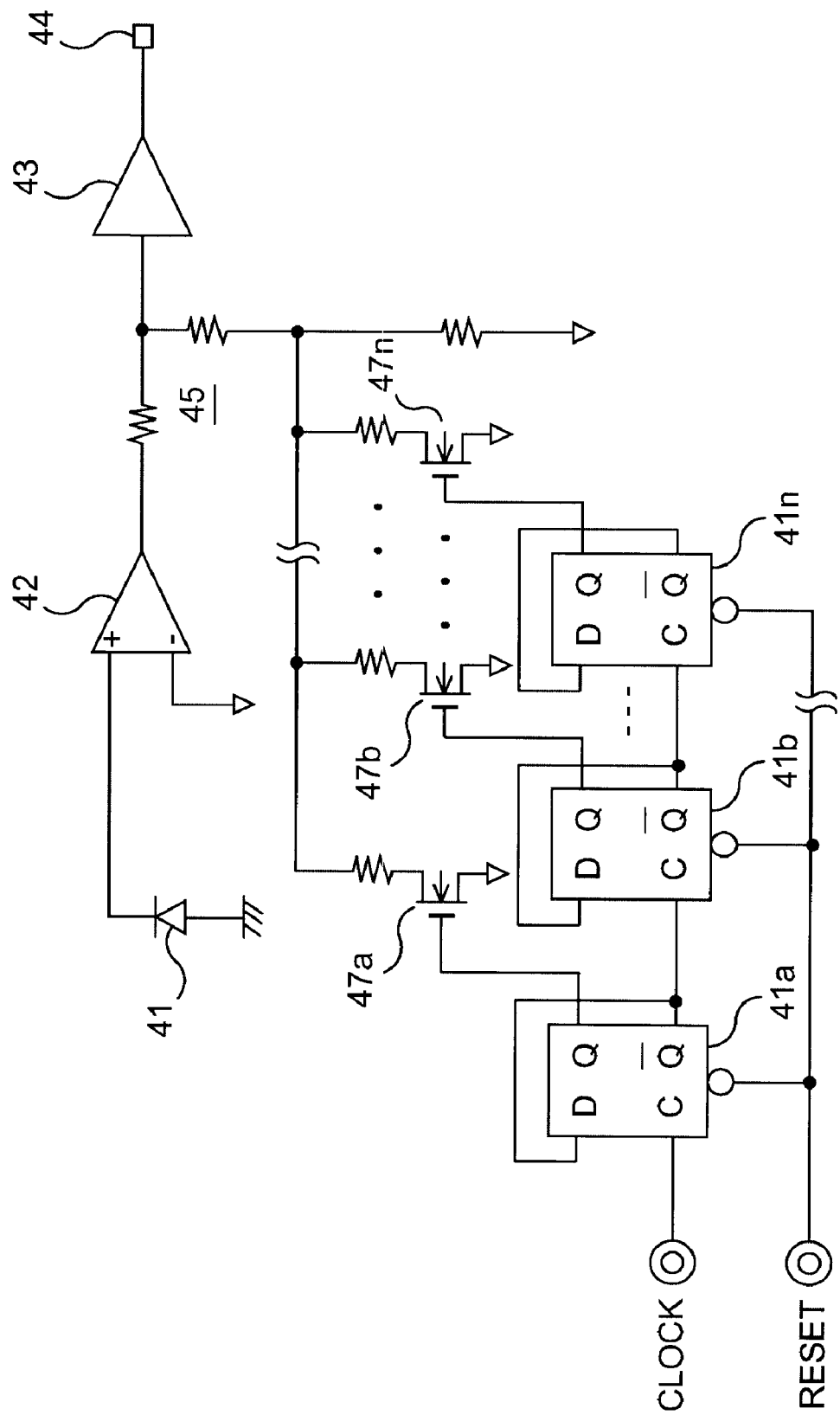
FIG. 4 is a circuit diagram describing a method of correcting each light reception output from each terminal by changing an attenuation amount of the output of each current/voltage conversion amplifier with an attenuator.

As shown in FIG. 4, it is also preferable to correct each light reception output from each output terminal of the photo detector by guiding the light reception output from a predetermined segment 41 of the light reception region to an output terminal 44 via a current/voltage conversion amplifier 42 and a subsequent amplifier 43 and changing the attenuation amount of the output of the current/voltage conversion amplifier 42 with an attenuator 45. The circuit of FIG. 4 controls a plurality of FET 47a, 47b . . . 47n, i.e., switch circuits with a plurality of D-FF (D type Flip Flops) 46a, 46b . . . 46n in cascade connection using the clock corresponding to the setting data and switches resistance values of a voltage dividing resistances 48a, 48b . . . 18n to change the attenuation amount, and the D-FF 46a, 46b . . . 46n and the FET 47a, 47b . . . 47n correspond to the output setting circuit 15.

The above description is for the purpose of facilitating the understanding of the present invention and is not intended to limit the present invention. The present invention may be changed and altered without departing from the spirit thereof and encompasses the equivalents thereof.

What is claimed is:

1. A light reception output controlling apparatus of a photo detector in an optical pickup unit, the optical pickup unit configured to guide a laser beam emitted from a laser source to an objective lens, to converge the laser beam with the objective lens to be irradiated to a disk, and to guide the laser beam reflected and returned by the disk to the photo detector including a light reception region constituted by a plurality of segments, the light reception output controlling apparatus comprising:
an amplifier provided in the photo detector corresponding to each of the segments of the light reception region;
an output terminal provided in the photo detector, the output terminal outputting a light reception output corresponding to each of the segments via each of the amplifiers; and
an output setting circuit that sets each light reception output from each of the output terminals by changing a gain of each of the amplifiers and/or by attenuating an input or output of each of the amplifiers with an attenuator,
wherein each light reception output from each of the output terminals is corrected with the output setting circuit depending on an output difference generated in each light reception output from each of the output terminals based on a position of a light reception spot projected on the light reception region.

2. The light reception output controlling apparatus of a photo detector in an optical pickup unit of claim 1, further comprising:
a control circuit provided to the optical pickup unit that supplies the output setting circuit with setting data for setting each light reception output from each of the output terminals;
a memory circuit provided to the optical pickup unit that stores the setting data for setting each light reception output from each of the output terminals with the output setting circuit,
wherein each light reception output from each of the output terminals is corrected based on the setting data stored in the memory circuit.

3. The light reception output controlling apparatus of a photo detector in an optical pickup unit of claim 2,
wherein the control circuit is disposed in a semiconductor integrated circuit constituting the photo detector and wherein the control circuit reads the setting data stored in the memory circuit and transfers the setting data to the photo detector.

4. The light reception output controlling apparatus of a photo detector in an optical pickup unit of claim 2,
wherein the control circuit is disposed in a semiconductor integrated circuit constituting the memory circuit and wherein the control circuit reads the setting data stored in the memory circuit and transfers the setting data to the photo detector.

5. The light reception output controlling apparatus of a photo detector in an optical pickup unit of claim 2,
wherein in the optical pickup unit employing an astigmatic method for a focus control that focuses the laser beam irradiated to the disk on a signal layer of the disk, the setting data for adjusting each light reception output from each of the output terminals are written into the memory circuit based on each light reception output acquired at the time of an inspection process that inspects each light reception output from each of the output terminals of the photo detector after an attachment process of the photo detector.

6. The light reception output controlling apparatus of a photo detector in an optical pickup unit of claim 2,
wherein the control circuit reads the setting data in the memory circuit at the time of start-up when a power supply voltage is applied and controls the output setting circuit based on the setting data to set each light reception output from each of the output terminals of the photo detector.

7. The light reception output controlling apparatus of a photo detector in an optical pickup unit of claim 1, wherein in the optical pickup unit configured to guide a laser beam reflected and returned by the disk to the photo detector including the light reception region divided into at least four parts by two dividing lines orthogonal to each other,
when a focus error signal for determining that the laser beam irradiated to the disk is focused on the signal layer of the disk, is generated, each light reception output from each of the output terminals of the photo detector is set by the output setting circuit so as to equalize a value of each addition signal acquired by adding each light reception output from each of four segments divided by the dividing lines of the light reception region
for each region divided in two at least by a dividing line corresponding to a direction orthogonal to a tracking direction.

8. The light reception output controlling apparatus of a photo detector in an optical pickup unit of claim 1, wherein
the photo detector includes the light reception region for receiving the laser beam reflected and returned by the disk, the light reception region being divided into at least four parts by two dividing lines orthogonal to each other, and wherein
in the optical pickup unit employing an astigmatic method for the focus control that focuses the laser beam irradiated to the disk on the signal layer of the disk,
the focal point of the laser beam irradiated to the disk is moved back and forth to set each light reception output from each of the output terminals by the output setting circuit so as to equalize a peak of a value of each addition signal acquired by adding each light reception output from each of the output terminals for each region of the light reception region of the photo detector divided in two by the dividing line corresponding to the direction orthogonal to the tracking direction on this occasion.

9. The light reception output controlling apparatus of a photo detector in an optical pickup unit of claim 8,
wherein the focal point of the laser beam irradiated to the disk is moved back and forth to set each light reception output from each of the output terminals by the output setting circuit so as to equalize the peak of the value of each addition signal acquired by adding each light reception output from each of the output terminals for each region of the light reception region of the photo detector divided in two by the dividing line corresponding to the tracking direction on this occasion.

10. The light reception output controlling apparatus of a photo detector in an optical pickup unit of claim 1,
wherein each light reception output from each of the output terminals is corrected to maintain a total light reception output corresponding to a total light amount acquired by summing each light reception output approximately constant when setting each light reception output from each of the output terminals of the photo detector with the output setting circuit depending on an output difference generated in each light reception output from each of the output terminals.

* * * * *